(12) United States Patent
Yang et al.

(10) Patent No.: US 6,579,809 B1
(45) Date of Patent: Jun. 17, 2003

(54) IN-SITU GATE ETCH PROCESS FOR FABRICATION OF A NARROW GATE TRANSISTOR STRUCTURE WITH A HIGH-K GATE DIELECTRIC

(75) Inventors: Chih-Yuh Yang, San Jose, CA (US); Cyrus E. Tabery, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/147,623

(22) Filed: May 16, 2002

(51) Int. Cl.[7] .................. H01L 21/461; H01L 21/336
(52) U.S. Cl. .................. 438/734; 438/706; 438/287; 438/197
(58) Field of Search ............... 438/689, 706, 438/710, 717, 734, 736, 749, 751, 761, 595, 585

(56) References Cited

U.S. PATENT DOCUMENTS

| | | |
|---|---|---|
| 5,055,383 A | 10/1991 | Koblinger et al. |
| 5,378,309 A | 1/1995 | Rabinzohn |
| 6,174,818 B1 | 1/2001 | Tao et al. |
| 6,283,131 B1 * | 9/2001 | Chen et al. .................. 134/1.2 |
| 6,451,647 B1 * | 9/2002 | Yang et al. .................. 438/240 |
| 6,482,726 B1 * | 11/2002 | Aminpur et al. ............ 438/585 |

* cited by examiner

Primary Examiner—Long Pham
Assistant Examiner—Aneta Cieslewicz
(74) Attorney, Agent, or Firm—Renner, Otto, Boisselle & Sklar

(57) ABSTRACT

The invention provides a method of small geometry gate formation on the surface of a high-k gate dielectric wherein process complexity and processing costs are reduced while throughput and overall process efficiency is improved. The method may utilize photolithography illumination of 157 nm, 193 nm, 248 nm, or other suitable wavelengths to mask a gate region. An aggressive mask trim may be used to reduce the mask size such that it masks a narrow gate region. A hard mask is then fabricated over the narrow gate region and the gate and high-k dielectric are etched to expose the silicon substrate. The entire etch sequence can be performed in-situ within a single gate etch chamber.

20 Claims, 5 Drawing Sheets

IN-SITU GATE ETCH PROCESS FOR FABRICATION OF A NARROW GATE TRANSISTOR STRUCTURE WITH A HIGH-K GATE DIELECTRIC

TECHNICAL FIELD

The present invention relates generally to the fabrication of silicon gate structures and more specifically to a method for using in-situ photoresist trim, gate etch, and high-k dielectric removal along with small-wavelength photolithography to fabricate a transistor gate of a dimension below that which could be achieved by small-wavelength photolithography alone, thus enabling creation of a higher density gate array on a silicon integrated circuit (IC).

BACKGROUND OF THE INVENTION

Silicon-based integrated circuits often utilize a field effect transistor (FET) structure that comprises a polysilicon gate positioned over a channel region within a silicon wafer, with a dielectric layer insulating the polysilicon gate from the channel region over which the polysilicon gate is positioned.

As is well-known to those of ordinary skill in the relevant art, a photolithographic process is commonly used to fabricate the polysilicon gate. This process involves making a laminate structure, and then selectively removing portions of that laminate to create the desired structure, which in this case is a gate. The laminate structure typically comprises a substantially planar silicon wafer substrate. Upon this substrate are deposited an oxide layer; upon the oxide layer is deposited a polysilicon layer; upon the polysilicon layer is deposited an anti-reflective coating (ARC) layer; upon the anti-reflective coating (ARC) layer is deposited a photoresist layer. A reticle containing pattern representing the desired structure is positioned between an illumination source and the photoresist layer, such that the photoresist is patterned. Next, the photoresist is developed so as to mask the polysilicon gate. An anisotropic etch is then used to remove the un-masked polysilicon such that the polysilicon gate is formed.

Ordinarily, the size of the structure (e.g., a gate) ultimately fabricated corresponds to the size of the photoresist structures deposited during the photolithographic process. That size, in turn, is dependent on wavelength, such that smaller sizes are generally produced by (and therefore generally require) smaller wavelengths.

Since, generally speaking, gate size reduction leads to increased performance, it is a generally recognized goal to decrease the size of the polysilicon gate. First, decreasing the gate size permits decreasing the size of each individual silicon device. Decreasing the size of each device provides the ability to increase the density of a device array fabricated on a wafer which provides the ability to fabricate a more complex circuit with a faster operating speed on a wafer of a given size. Secondly, a smaller channel region beneath a smaller gate reduces capacitance across the channel/source junction and the channel drain junction which provides for faster operating speed and reduced power consumption.

However, it is difficult to reduce gate size. Ordinarily, limitations on the masking and etching processes limit gate size. For example, the resolution of the photoresist masking processes provides a lower limit on the minimum gate size. For other reasons, etching processes for etching vertical surfaces perpendicular to the horizontal mask further limit the minimum gate size due to erosion and other effects that degrade the etch profile.

One caveat remains: while reducing gate size is generally desirable, there does exist a minimum physical thickness of the gate oxide below which the oxide no longer insulates the gate from the channel region. To avoid this limitation, the gate may be formed from dielectrics with dielectric constants greater than silicon dioxide (e.g. high-k dielectrics), rather than the convention gate material, i.e. silicon dioxide, may be used to replace the conventional gate oxide to improve capacitive coupling. Advantageously, the use of high-k dielectric also provides improved capacitive coupling between the gate and the channel region, so as to provide the improved capacitive coupling required by a smaller gate size. However, high-k dielectric gate material reacts to various etching chemistries differently than does the usual dielectric gate material (silicon dioxide) and therefore the use of a high-k gate dielectric requires different fabrication methods than a similar structure with a conventional gate oxide.

Accordingly there is a strong need in the art for a narrow gate transistor structure that includes a high-k gate dielectric material and a method of forming same. It is preferable that such method provide for patterning a hard mask using short wavelength lithography to minimize feature size and provide for resist trimming to further reduce feature size. Preferably such method provides for in-situ resist trimming, hard mask formation, gate etch, and dielectric etch.

SUMMARY OF THE INVENTION

The present invention provides an efficient method of small geometry gate formation on the surface of a high-k gate dielectric. The method provides for processing steps that include photoresist mask trimming, hard mask formation, gate stack etching, and the removal of exposed regions of the high-k dielectric to be performed efficiently in a single etch chamber. Such method of performing in-situ resist trim, hard mask formation, gate etch, and high-k gate dielectric removal provides for a simplified process over known fabrication methods along with improving throughput. The method also reduces wafer handling and opportunities for contamination. The method comprises fabricating a gate dielectric etch stop layer above a silicon substrate. The gate dielectric etch stop layer comprising a material that has a dielectric constant greater than the dielectric constant of silicon dioxide and forms the gate dielectric in a region of the wafer that becomes the gate and forms a barrier to prevent polysilicon etching chemistries from damaging the silicon substrate in regions along side the gate. The method further comprises sequentially: a) fabricating a polysilicon layer above the gate dielectric etch stop layer; b) fabricating a hard mask layer above the polysilicon layer; and c) fabricating a photoresist layer over the hard mask layer. The photoresist layer is then patterned and developed to form a photoresist mask over a gate region and to expose an erosion region about and outside the periphery of the gate region.

The wafer is placed in an enclosed etching environment with high density plasma and, optionally an inert gas. The inert gas may be argon. While in such an etching environment the following etch processes are in-situ performed. First, a portion of the photoresist mask is etched to form a trimmed photoresist mask over a narrow gate region and to increase the size of the erosion region using an etch chemistry selective between the photoresist and the hard mask layer. The trimmed photoresist mask dimension is smaller the capability of either 248 nm or 193 nm lithography. Secondly, the hard mask layer is etched to form a hard mask over the narrow gate region and to expose the polysilicon in the erosion region. The polysilicon layer is then etched using an etch chemistry selective between the polysilicon and each of the hard mask and the gate dielectric etch stop layer. The gate dielectric etch stop layer is removed using an etch chemistry selective between the gate dielectric etch stop layer and both the polysilicon and the hard mask. And, finally, the hard mask is removed using wet etch.

The gate dielectric etch stop layer may comprise a high-k material selected from the group of $HfO_2$, $ZrO_2$, $CeO_2$, $Al_2O_3$, $TiO_2$, $Y_2O_3$. Within the environment, the step of trimming or etching a portion of the photoresist mask may comprise use of at least one of HBr, $CL_2$, $N_2$, He and $O_2$ and the step of forming the hard mask may comprise etching the hard mask coating using $CF_4$ or $CHF_3$. The step of etching the polysilicon layer may comprise use of HBr, $Cl_2$, $CF_4$, and $HeO_2$ (which is not truly a compound but industry shorthand for a combination of Oxygen diluted with a large amount of Helium provided to the etch chamber through a single mass flow controller), in a bias field to improve a vertical side profile between the gate region and the erosion region of the polysilicon. The $HeO_2$ increases the selectivity between the polysilicon and the gate dielectric etch stop layer. Other etch parameters may also be used to improve the selectivity between the polysilicon and the gate dielectric etch stop layer. The step of removing the gate dielectric etch stop layer comprises use of HBr and He with the addition of Fluorine (F) gas. Alternatively. The step may comprise use of $O_2$ and an inert gas with the addition of Fluorine gas.

For a better understanding of the present invention, together with other and further aspects thereof, reference is made to the following description, taken in conjunction with the accompanying drawings, and its scope will be pointed out in the appended claims.

DESCRIPTION OF THE PREFERRED EMBODIMENTS

The present invention will now be described in detail with reference to the drawings. The diagrams are not drawn to scale and the dimensions of some features are intentionally drawn larger than scale for purposes of showing clarity.

Figure 1:
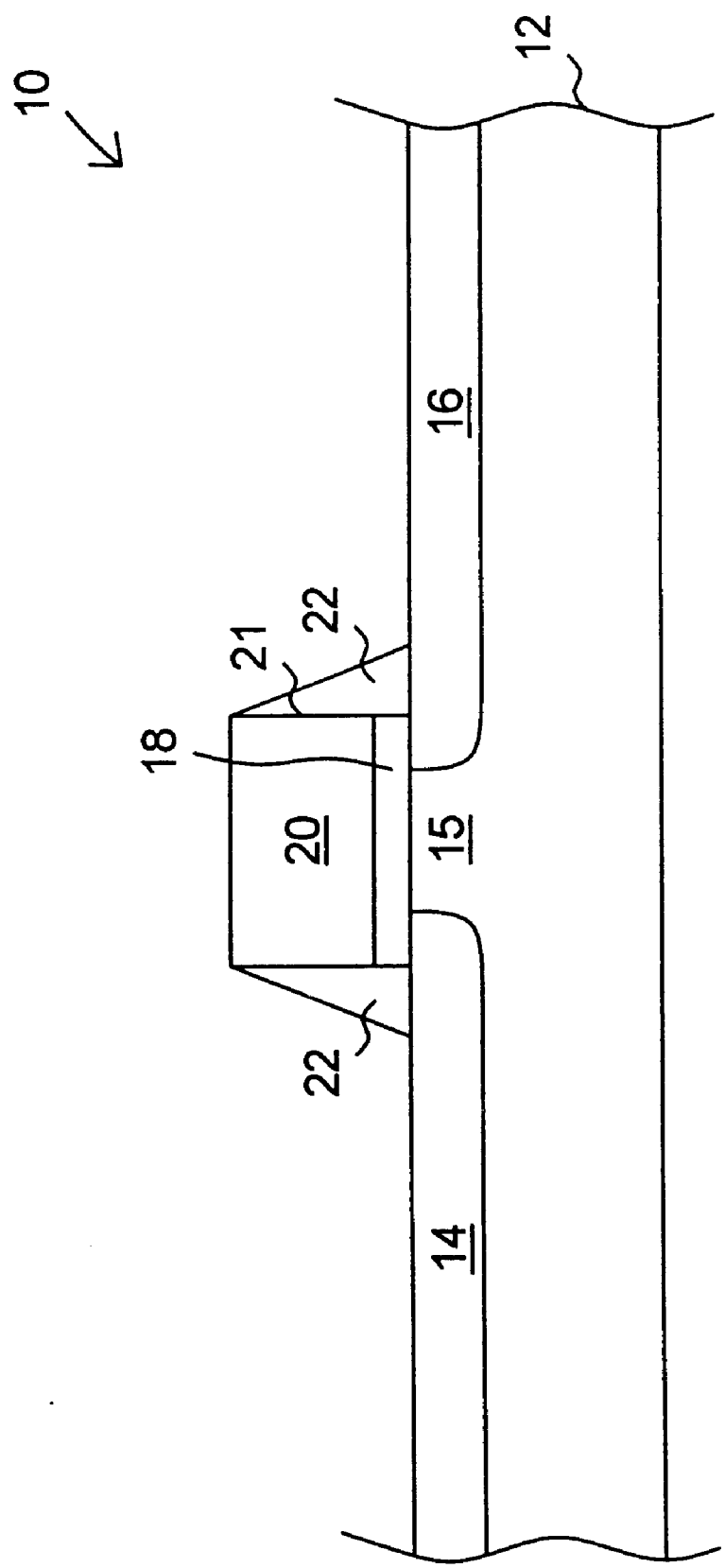
FIG. 1 is a schematic, cross sectional view of a narrow gate field effect transistor silicon device in accordance with one embodiment of the present invention.

Referring to FIG. 1, an exemplary field effect transistor (FET) 10 in accordance with the present invention is shown. The FET 10 comprises a lightly doped p-type crystalline silicon substrate 12 and an implanted n-type source region 14 and drain region 16. However, it should be appreciated that the lightly doped silicon substrate may be n-type and the source region 12 and the drain region 16 may be implanted p-type. Between the source region 14 and the drain region 16 is a central channel region 15. Above the central channel region 15 is a mesa 21 comprising a gate dielectric layer 18 and a polysilicon gate 20. Side wall spacers 22 isolate the mesa 21. In the exemplary embodiment, the gate dielectric layer 18 comprises a material with a dielectric constant greater than that of silicon dioxide which is typically used for a gate oxide layer.

The benefit of a gate dielectric layer 18 with a dielectric constant greater than that of silicon dioxide is that the physical thickness of the gate dielectric layer 18 may be greater without reduced capacitive coupling between the polysilicon gate 20 and the channel region 15. Or, stated in the alternative, a gate dielectric layer 18 with a dielectric constant greater than silicon dioxide provides greater capacitive coupling between the polysilicon gate 20 and the channel region 15 than would a dielectric layer comprising silicon dioxide of the same physical thickness. Because greater capacitive coupling between the polysilicon gate 20 and the channel region 15 is required when the length of the channel region 15 (the distance between the source region 14 and the drain region 16) is reduced, the gate dielectric layer 18 with a dielectric constant greater than that of silicon dioxide permits the FET 10 to have a channel length below the minimum length that would be required to properly couple the polysilicon gate 20 to the channel region 15 through the minimum physical thickness of silicon dioxide required to prevent electron tunneling between the polysilicon gate 20 and the channel region 15.

In the exemplary embodiment, the gate dielectric layer 18 comprises a material selected from the group of $HfO_2$, $ZrO_2$, $CeO_2$, $Al_2O_3$, $TiO_2$, $Y_2O_3$, and other binary and tertiary metal oxides and ferroelectric material having a dielectric constant greater than 20. The selected material is referred to herein as a "high-k material" because it has a dielectric constant greater than silicon dioxide and therefore provides capacitive coupling equivalent to an oxide thickness of one nanometer or less while maintaining an adequate physical thickness to prevent charge tunneling. Because some of the materials in the group may form an incompatible boundary with crystalline silicon, a barrier interface layer may exist both above and below the high-k gate dielectric layer 18 to provide a buffer interface between the high-k material and the polysilicon gate 20 and a buffer interface between the high-k material and the polysilicon channel region 15. Each buffer interface layer may be silicon dioxide having a thickness of about 0.5 nm to about 0.7 nm.

Because the high-k material has a dielectric constant approximately 3 times that of silicon dioxide, the thickness of the gate dielectric layer 18 may be approximately 3 times greater than that of silicon dioxide and yet there will be the same capacitive coupling between the polysilicon gate 20 and the channel region 15. Comparing a FET with a silicon dioxide gate dielectric layer with FET 10 with the high-k material underlying layer of approximately the same thickness, the other dimensions of FET 10 may be approximately three times smaller than those of the FET with the silicon dioxide gate layer.

Figure 2:
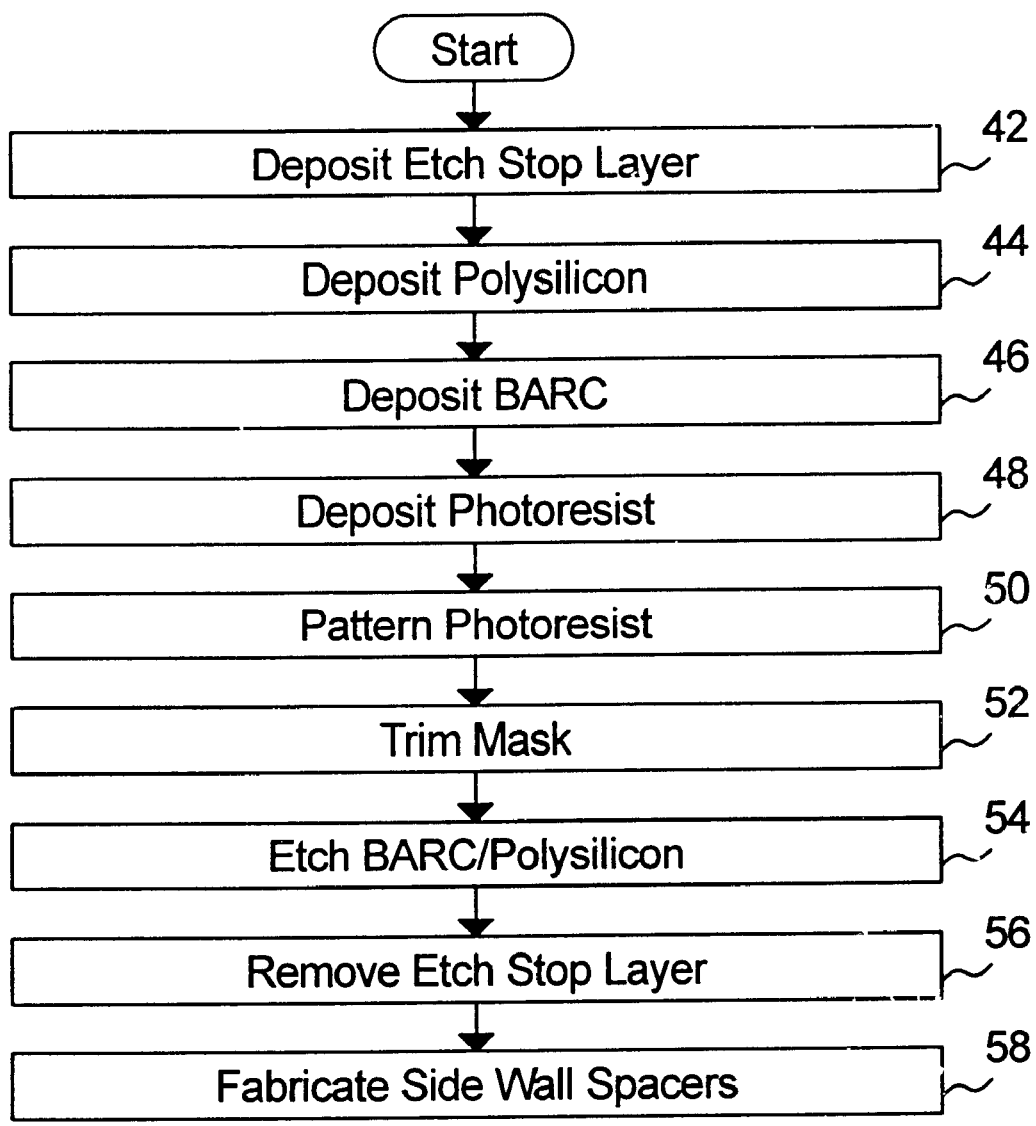
FIG. 2 is a flow chart showing exemplary steps for fabricating a narrow gate silicon device in accordance with one embodiment of the present invention.

Turning to the flowchart of FIG. 2 in conjunction with the schematic cross section diagrams of FIGS. 3a–3g, an exemplary process for fabricating the gate 20 of FIG. 1 is shown.

Step 42 represents depositing a gate dielectric etch stop layer 62 on the surface of a silicon substrate 60. The gate dielectric etch stop layer 62 will become the gate dielectric layer 18 of the mesa 21. In the exemplary embodiment, the gate dielectric etch stop layer 62 comprises the high-k material. More specifically, step 42 may represent first depositing a buffer interface layer of silicon dioxide on the surface of the silicon substrate using low temperature thermal oxidation, a remote plasma deposition process, an atomic layer deposition process, or a similar process for fabricating silicon dioxide on silicon to an approximate thickness of 0.5 nm–0.7 nm. Secondly, the high-k material may be deposited on the buffer interface layer using low pressure chemical vapor deposition to a thickness selected to provide adequate capacitive coupling appropriate for the selected channel length. And thirdly, another buffer interface layer of silicon dioxide is fabricated, on the surface of the high-k material, again to a thickness of approximately 0.5 nm–0.7 nm using the techniques discussed above.

Step 44 represents depositing a polysilicon layer 64 on the surface of the gate dielectric etch stop layer 62 (or the buffer interface layer if used). This polysilicon layer 64 will become the polysilicon gate 20 and may have a thickness on the order of 700 to 1500 Å (angstrom). In the exemplary process the polysilicon layer 64 is deposited using a low pressure chemical vapor deposition process.

Step 46 represents depositing a hard mask layer 66 on the surface of the surface of the polysilicon layer 64. The hard mask layer 66 may also serve as an anti-reflection coating for the particular photoresist utilized. The hard mask layer 66 may comprise a material with a high etch selectivity to polysilicon such that after etching the hard mask layer 66 to form a hard mask over a narrow gate region of the polysilicon layer 64, the polysilicon layer 64 may be etched with an increased bias power and a reduced pressure to improve gate side wall tolerances. In the exemplary embodiment the hard mask coating may be silicon oxynitride or silicon rich nitride (SiRN) and may have a thickness on the order of 400 Å to 600 Å. Low pressure chemical vapor deposition or plasma enhanced chemical vapor deposition may be used to deposit the hard mask layer 66.

Figure 3A:
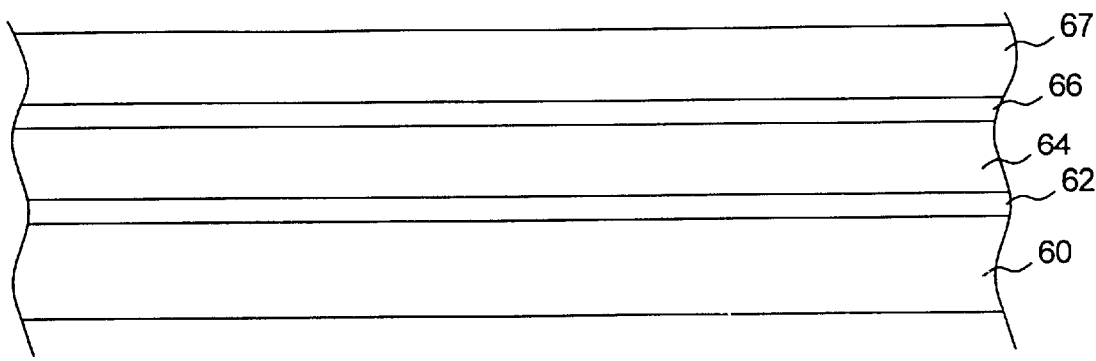
FIG. 3a is a schematic cross sectional view of a processing step in the fabrication of a narrow gate silicon device in accordance with one embodiment of the present invention.
Figure 3B:
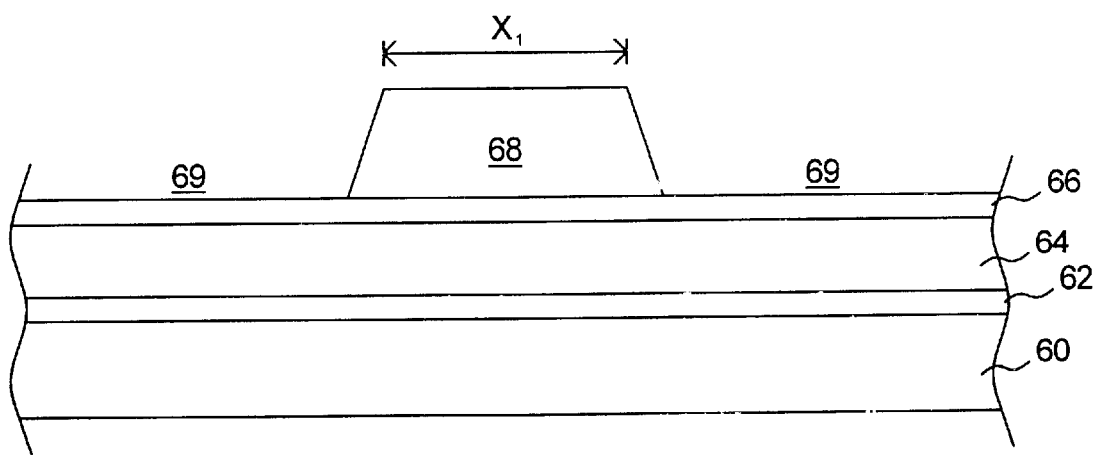
FIG. 3b is a schematic cross sectional view of a processing step in the fabrication of a narrow gate silicon device in accordance with one embodiment of the present invention.

Step 48 represents depositing a mask layer 67 of a photoresist material on the surface of the hard mask layer 66, as is shown in FIG. 4a. As is well-known to those skilled in the art, the photoresist is a very thin coating of a material which is often, though not necessarily, a polymer, and which is applied to the hard mask layer 66. The portion of the photoresist mask which is illuminated (i.e. which does not have its light occluded by the reticle mask) will react with light of the illumination wavelength (e.g. 193 nm or 248 nm) such that the solubility of the exposed areas of photoresist will, for certain solvents, differ from that of the solubility of the unexposed areas of the photoresist. This facilitates selective removal of the photoresist, so that areas of the hard mask layer 66 are made free of photoresist, and are thereby made available for reactions and modifications while the rest of the wafer is protected by the exposed photoresist. In the exemplary embodiment, the photoresist material is a 193 nm or a 248 nm photoresist material, which supports patterning of a developed image critical dimension (DICD)×1 on the order of 90 nm to 180 nm for a typical 0.18 micron technology node. The thickness of the mask layer 67 is dependent upon the optical properties of the photoresist material and the target DICD. In an exemplary embodiment, a 248 nm photoresist would be deposited to a thickness of between 1500 Å and 5000 Å or, for a more narrow range, a thickness of between 2000 Å and 4000 Å. In the exemplary embodiment, a 193 nm photoresist would be deposited to a thickness of between 1000 Å and 4500 Å, or, for a more narrow range, a thickness of between 2000 Å and 3500 Å. In the exemplary embodiment, a 157 nm photoresist would be deposited to an appropriate thickness, e.g. 2000–3000 Å, as is well-known to those skilled in the relevant art. In this regard, guidance may be found in this paper: "Meeting the Challenge: The 157 nm Resist Development Program at International SEMATECH" (Jun. 29, 2001) future fab [sic] Volume 11, by Eugene D. Feit, International Sematech (the entire contents of which, including the contents of references made therein, is hereby incorporated by reference.) Step 50 represents patterning the photoresist using conventional stepper or scanner photolithography technologies to form a mask 68 on the surface of the ARC layer 66 that defines and masks a gate region 68 and defines and exposes an erosion region 69 as is shown in FIG. 3b.

More specifically, an illumination light source (e.g. a 157 nm, 193 nm, 248 nm, or other wavelength light source) and a reticle provides collimated illumination of a wavelength that corresponds to the selected photoresist material to expose and pattern the photoresist layer 67. A developer solution preserves the unexposed areas of the photoresist layer 67 and washes the photoresist away in the exposed portions thereby leaving the unexposed portions as a photoresist mask on the surface of the BARC layer 66 within the gate region 68. It should be appreciated that the photolithography processes have a resolution limit that ordinarily determines the minimum size of the photoresist mask.

Therefore, because one of the objectives of this invention is to provide a narrow gate that is smaller than the limits of resolution of the photolithography processes, in the exemplary embodiment, the photolithography processes are used to make the minimum sized photoresist mask in accordance with known methods. Known photolithography processes can be used to form a gate mask with a DICD×1 of approximately 90 nm to 180 nm.

Figure 3C:
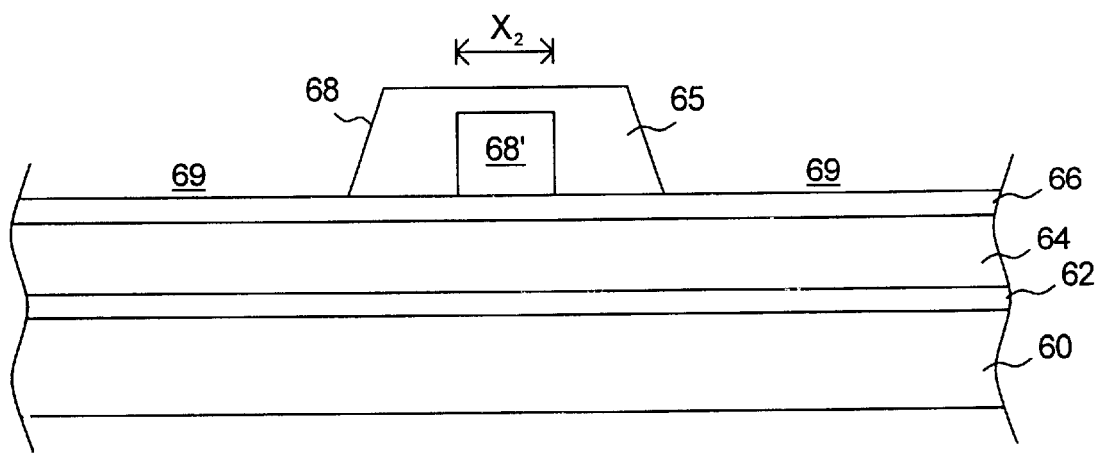
FIG. 3c is a schematic cross sectional view of a processing step in the fabrication of a narrow gate silicon device in accordance with one embodiment of the present invention.

Step 52 represents the first etching step in a series of etching steps that are to be performed utilizing etch chemistries that are compatible with each other and can be performed in a single etch environment without breaking the vacuum seal between etch steps. The environment may include high density plasma and may also include an inert gas such as Argon (Ar). As such, step 52 represents sealing the wafer in an etch chamber and etching the photoresist to trim the photoresist from the DICD dimension to a final image critical dimension "×2" to less than 50 nm, or for a more narrow range, to less than 30 nm. More specifically, the mask is eroded or trimmed to form a narrow gate mask that masks a narrow gate region 68' within the gate region 68 as is shown in FIG. 3c at step 52. In the exemplary embodiment, at least one of HBr, $Cl_2$, He, $N_2$, and $O_2$ is used to etch the mask such that the narrow mask region 68' remains while the portion 65 is removed. Note that this step has reduced the size of the structure below the minimum size achievable by the use of Optics alone.

Figure 3D:
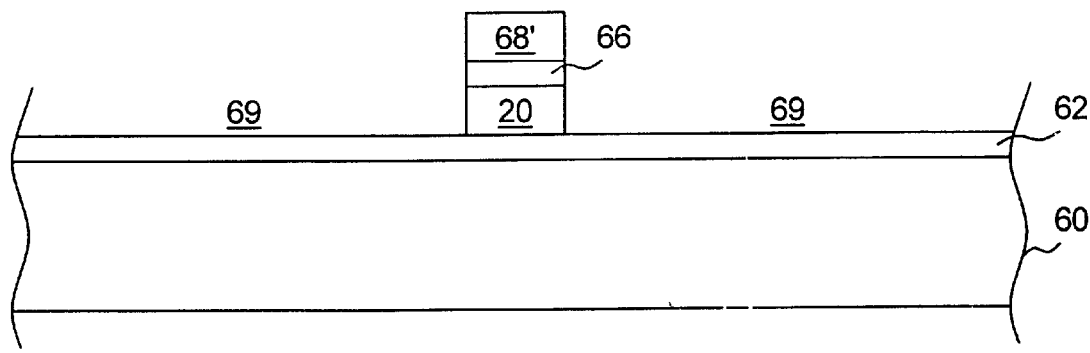
FIG. 3d is a schematic cross sectional view of a processing step in the fabrication of a narrow gate silicon device in accordance with one embodiment of the present invention.
Figure 3E:
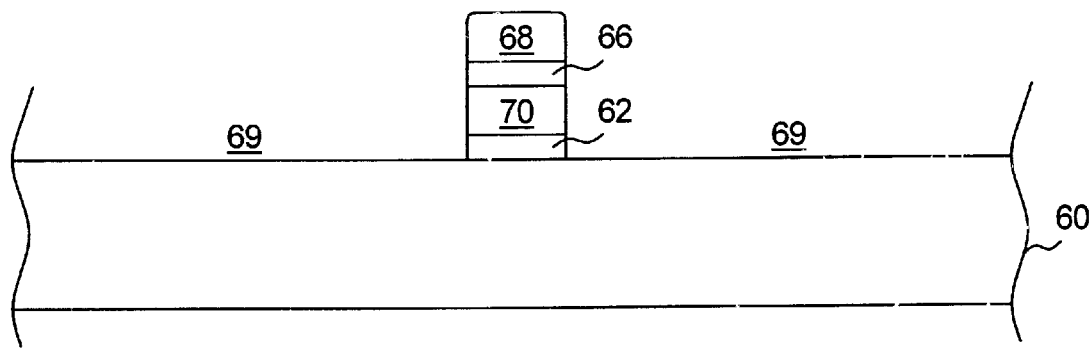
FIG. 3e is a schematic cross sectional view of a processing step in the fabrication of a narrow gate silicon device in accordance with one embodiment of the present invention.

Step 54 represents etching the hard mask layer 66 to form a hard mask over the narrow gate region 68' and etching the polysilicon layer 64 in the erosion region 69 that is not protected by the hard mask to form the polysilicon gate 20 as is shown in FIG. 3d. Etching the hard mask layer 66 may include use of an etch chemistry that is selective between the hard mask layer 66 and both the photoresist and polysilicon. Such an etch chemistry may include use of $CF_4$ or $CHF_3$ in the inert gas environment. An in-situ resist strip step following the hard mask etch step will remove all the remaining photoresist, so that the hard mask masks the polysilicon layer (instead of the trimmed photoresist mask) for etching of the polysilicon layer 64 and subsequent high-k removal. The resist strip uses $O_2$ chemistry.

Etching the polysilicon layer 64 may include an ion bombardment etch using HBr, $CF_4$, $CL_2$ in combination with $HeO_2$ to increase the selectivity between the polysilicon and the high-k material in the gate dielectric etch stop layer 62. Other etch parameters may also be adjusted to assure that the polysilicon etch is generally un-reactive with the hard mask and with the underlying high-K material. Increasing the selectivity enables the etch to be performed with an increased bias power and a reduced pressure (than would be enabled without the $HeO_2$) without causing the etch to penetrate the gate dielectric etch stop layer 62. This increased bias power and reduced pressure improves the vertical tolerance of the gate 20 side wall profile.

At step 56, the gate dielectric etch stop layer 62 within the erosion region 69 is removed using an etch chemistry of HBr, He, or $CF_4$ in the environment which is selective between the high-k material and polysilicon. As such, the erosion at step 56 does not significantly effect the sidewall profile of the gate 20 and does not significantly penetrate into the polysilicon layer 64 beneath the gate dielectric etch stop layer 62.

Finally, the wafer may be wet cleaned and the hard mask removed using a we etch such as hot phosphoric acid. It should be appreciated that the above described etch chemistries are compatible chemistries and may performed sequentially within the etch chamber without the breaking the vacuum seal.

Figure 3F:
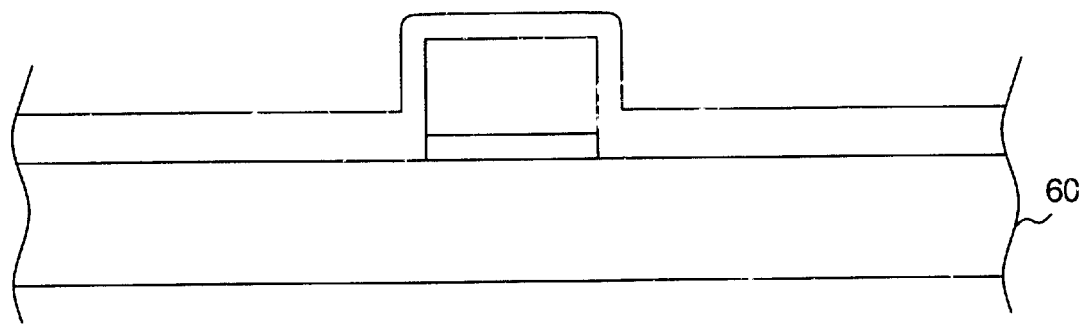
FIG. 3f is a schematic cross sectional view of a processing step in the fabrication of a narrow gate silicon device in accordance with one embodiment of the present invention.
Figure 3G:
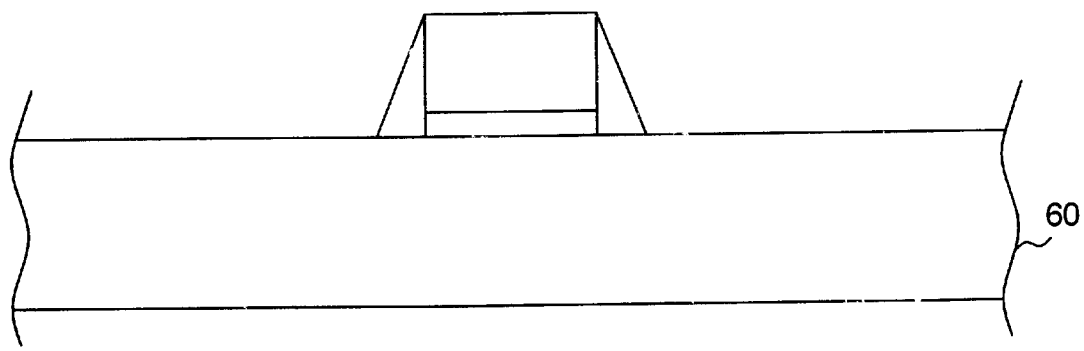
FIG. 3g is a schematic cross sectional view of a processing step in the fabrication of a narrow gate silicon device in accordance with one embodiment of the present invention.

Step 58 represents fabricating side wall spacers by depositing a nitride layer over the entire surface of the device as is shown in FIG. 3f, and represents use of an anisotropic etch to remove the nitride from the horizontal surfaces leaving side wall spacers 22 as shown in FIG. 3g.

In summary, the processes for fabricating a narrow mesa structure of this invention provides for fabrication of a smaller cell with improved sidewall tolerance. Although the methods have been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A method for forming a field effect transistor gate which is narrow, comprising:
   depositing a high-k gate dielectric etch stop layer on a silicon wafer substrate;
   depositing a polysilicon layer on the gate dielectric etch stop layer;
   depositing a hard mask layer on the polysilicon layer;
   depositing a photoresist on the hard mask layer;
   patterning the photoresist to form a photoresist mask over a gate region and expose a photoresist erosion region;
   developing the photoresist so as to remove the exposed photoresist within the erosion region thereby leaving a photoresist mask in the gate region;
   trimming the photoresist mask to form a narrow photoresist mask in a narrow gate region, the narrow gate region being within the gate region and smaller than the gate region;
   etching the hard mask layer to form a hard mask over the narrow gate region;
   etching the portion of the polysilicon layer which is not covered by the hard mask; and
   etching the portion of the high-k gate dielectric etch stop layer which is not covered by the hard mask, wherein, after developing the photoresist so as to remove all exposed photoresist erosion region, placing the substrate within an enclosed high density plasma etching environment and performing the remaining steps in-situ.

2. The method of claim 1 wherein the etching environment further comprises an inert gas.

3. The method of claim 2 wherein the gate dielectric etch stop layer comprises a material that has a dielectric constant greater than the dielectric constant of silicon dioxide.

4. The method of claim 3 wherein the gate dielectric etch stop layer comprises a high K material selected from the group consisting of $HfO_2$, $ZrO_2$, $CeO_2$, $Al_2O3$, $TiO_2$, and $Y_2O_3$.

5. The method of claim 4 wherein the trimming comprises exposure to an etch chemistry selective between the photoresist and the hard mask layer.

6. The method of claim 5 wherein the etch chemistry selective between the photoresist and the hard mask layer includes a chemical selected from the group consisting of HBr, $Cl_2$, He, $N_2$, and $O_2$.

7. The method of claim 6 wherein the step of forming the hard mask comprises exposing the hard mask layer to a compound selected from the group consisting of the following: $CF_4$ and $CHF_3$.

8. The method of claim 7 wherein the etching the portion of the polysilicon layer comprises exposure to an etch chemistry selective between the polysilicon and each of the hard mask and the gate dielectric etch stop layer.

9. The method of claim 8 wherein the etching the portion of the high-k gate dielectric etch stop layer comprises exposure to an etch chemistry selective between the gate dielectric etch stop layer and polysilicon.

10. The method of claim 9 wherein the step of etching the portion of the high-k gate dielectric etch stop layer comprises use of HBr, fluorinated gases, $O_2$, and an inert gas.

11. A method for forming a field effect transistor gate which is narrow, comprising:
   depositing a high-k gate dielectric etch stop layer on a silicon substrate;
   depositing a polysilicon layer on the gate dielectric etch stop layer;
   depositing a hard mask layer on the polysilicon layer;
   depositing a photoresist layer on the hard mask layer;
   patterning the photoresist to form a photoresist mask over a gate region and expose an erosion region;
   placing the substrate within an enclosed high density plasma etching environment and performing the following steps in-situ:
      etching a portion of the photoresist mask to form a trimmed mask over a narrow gate region and to increase the size of the erosion region using an etch chemistry selective between the photoresist and the hard mask layer;
      etching the hard mask layer to form a hard mask over the narrow gate region;
      stripping the photoresist;
      etching the polysilicon layer using an etch chemistry selective between the polysilicon and each of the hard mask and the gate dielectric etch stop layer; and removing the gate dielectric etch stop layer using an etch chemistry selective between the gate dielectric etch stop layer and polysilicon.

12. The method of claim 11 wherein the etching environment further comprises an inert gas.

13. The method of claim 12 wherein the gate dielectric etch stop layer comprises a material that has a dielectric constant greater than the dielectric constant of silicon dioxide.

14. The method of claim 13 wherein the gate dielectric etch stop layer comprises a high K material selected from the group consisting of $HfO_2$, $ZrO_2$, $CeO_2$, $Al_2O_3$, $TiO_2$, $Y_2O_3$.

15. The method of claim 14 wherein the etching a portion of the photoresist mask to form a trimmed mask comprises exposure to an etch chemistry selective between the photoresist and the hard mask layer.

16. The method of claim 15 wherein the etch chemistry selective between the photoresist and the hard mask layer includes a chemical selected from the group consisting of HBr, $Cl_2$, He, $N_2$, and $O_2$.

17. The method of claim 16 wherein the step of forming the hard mask comprises exposing the hard mask layer to a compound selected from the group consisting of the following: $CF_4$ and $CHF_3$.

18. The method of claim 17 wherein the etching the portion of the polysilicon layer comprises exposure to an etch chemistry selective between the polysilicon and each of the hard mask and the gate dielectric etch stop layer.

19. The method of claim 17 wherein the etching the portion of the high-k gate dielectric etch stop layer comprises exposure to an etch chemistry selective between the gate dielectric etch stop layer and polysilicon.

20. The method of claim 19 wherein the stop of etching the portion of the high-k gate dielectric etch stop layer comprises, use of HBr, fluorinated gases, $O_2$, and an inert gas.

* * * * *